United States Patent
Shin (10) Patent No.: US 7,348,816 B2
(45) Date of Patent: Mar. 25, 2008

(54) CIRCUIT AND METHOD FOR POWER-ON RESET

(75) Inventor: Chang-Ho Shin, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 53 days.

(21) Appl. No.: 11/338,202

(22) Filed: Jan. 24, 2006

(65) Prior Publication Data

US 2006/0164136 A1   Jul. 27, 2006

(30) Foreign Application Priority Data

Jan. 25, 2005  (KR) .................... 10-2005-0006519

(51) Int. Cl.
*H03L 7/00* (2006.01)
(52) U.S. Cl. .................... 327/143; 327/142; 327/198
(58) Field of Classification Search ............... 327/142, 327/143, 198
See application file for complete search history.

(56) References Cited

U.S. PATENT DOCUMENTS

| | | | |
|---|---|---|---|
| 6,160,429 A * | 12/2000 | Morrill | 327/143 |
| 6,204,703 B1 | 3/2001 | Kwon | 327/143 |
| 6,686,783 B1 * | 2/2004 | Huang | 327/143 |
| 6,737,884 B2 * | 5/2004 | Shigemasa et al. | 326/38 |
| 6,847,240 B1 * | 1/2005 | Zhou | 327/143 |
| 6,914,461 B2 * | 7/2005 | Kwon | 327/143 |
| 6,914,462 B2 * | 7/2005 | Kim et al. | 327/143 |
| 7,081,779 B2 * | 7/2006 | Kang | 327/143 |
| 7,161,396 B1 * | 1/2007 | Zhou et al. | 327/143 |
| 7,199,623 B2 * | 4/2007 | Kwon | 327/143 |
| 2004/0012419 A1 | 1/2004 | Kim et al. | 327/143 |

FOREIGN PATENT DOCUMENTS

JP   2001 0127609   11/2001

OTHER PUBLICATIONS

Vadasz et al., IEEE Transactions on Electron Devices, vol. ED-13, No. 12, Dec. 1966, pp. 863-866.*
English Abstract, 2001.

* cited by examiner

*Primary Examiner*—Tuan T. Lam
*Assistant Examiner*—Patrick O'Neill
(74) *Attorney, Agent, or Firm*—F. Chau & Associates, LLC.

(57) ABSTRACT

In a power-on reset circuit and a method of generating a power-on reset signal tolerant of variation of an ambient temperature, the power-on reset circuit includes a first power-on reset unit, a second power-on reset unit and a logic gate. The first power-on reset unit generates a first power-on reset signal that is activated at a first level of a power supply voltage at a first temperature, and is activated at a second level of the power supply voltage at a second temperature. The second power-on reset unit generates a second power-on reset signal that is activated at the second level at the first temperature, and is activated at the first level at the second temperature. The logic gate executes a logical disjunction operation or a logical conjunction operation of the first power-on reset signal and the second power-on reset signal and generates a third power-on reset signal.

33 Claims, 11 Drawing Sheets

CIRCUIT AND METHOD FOR POWER-ON RESET

CROSS-REFERENCE TO RELATED APPLICATIONS

This application claims the benefit under 35 U.S.C. § 119(a) of Korean Patent Application No. 2005-0006519 filed on Jan. 25, 2005, the contents of which are herein incorporated by reference in their entirety.

BACKGROUND OF THE INVENTION

1. Field of the Invention

The present invention relates to a power-on reset circuit and a method of generating a power-on reset signal. More particularly, the present invention relates to a power-on reset circuit and a method of generating a power-on reset signal tolerant of a variation in an ambient temperature.

2. Discussion of Related Art

A complementary metal oxide semiconductor (CMOS) device typically includes a power-on reset circuit. The power-on reset circuit is a circuit for activating internal circuits such as latch circuits, flip-flops, and so forth, after a power supply voltage is stabilized. A typical power-on reset circuit generates a power-on reset signal, which changes to, for example, a logic 'high', when the power supply voltage reaches a predetermined level after a power-up.

The design of a power-on reset circuit for a semiconductor device operating with the low power supply voltages is important.

Figure 1:
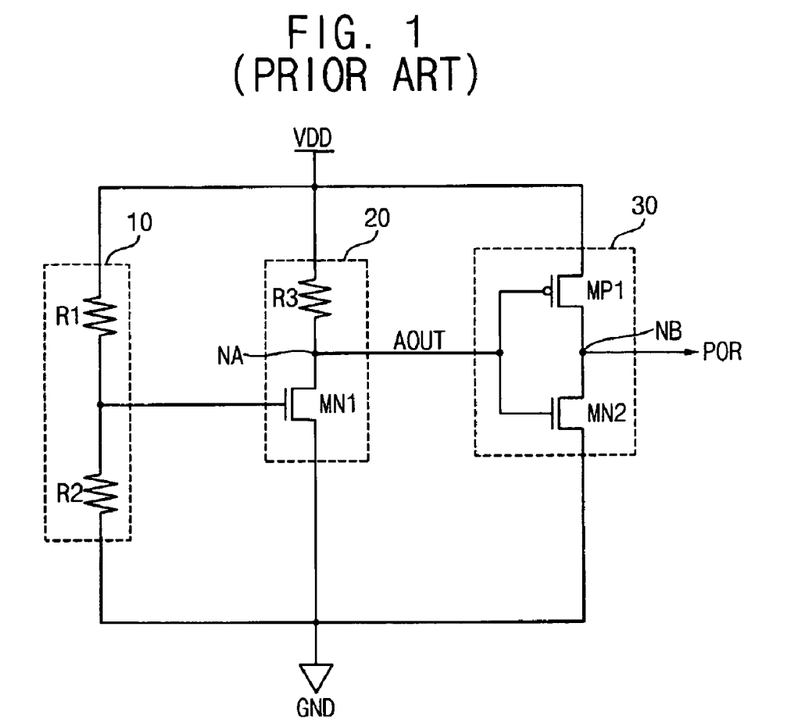
FIG. 1 is a circuit diagram illustrating a power-on reset circuit.
Figure 2:
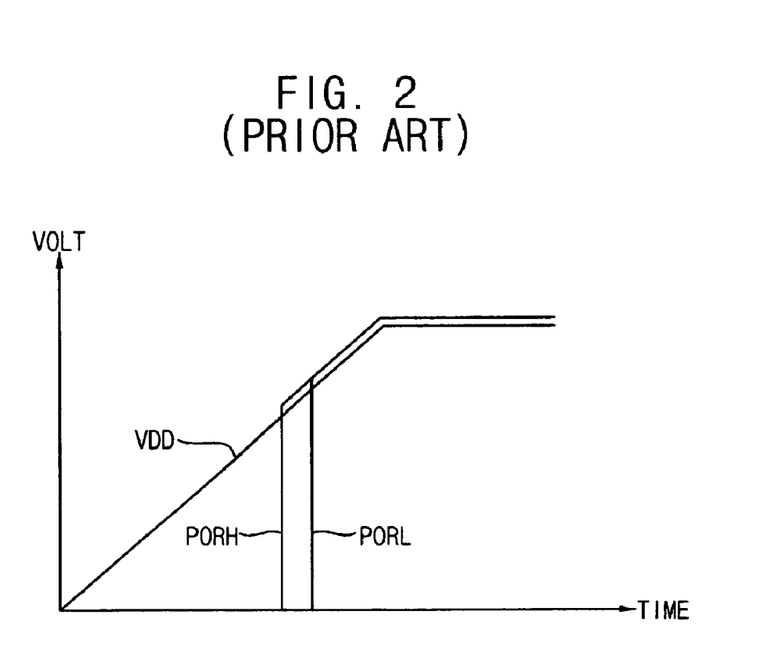
FIG. 2 is a graph showing an output waveform of the power-on reset circuit in FIG. 1 operated at a relatively high temperature and at a relatively low temperature.

FIG. 1 is a circuit diagram illustrating a power-on reset circuit. FIG. 2 is a graph showing an output waveform of the power-on reset circuit in FIG. 1 operated at a relatively high temperature and at a relatively low temperature. The power-on reset circuit in FIG. 1 is disclosed in the Korean Patent Laid-Open Publication No. 2004-0031861. Referring to FIG. 1, the power-on reset circuit includes a voltage divider 10, a first amplifier 20 and a second amplifier 30.

The voltage divider 10, comprising resistors R1 and R2, adjusts a level of a power supply voltage at which a power-on reset signal POR is activated. A voltage divided by the voltage divider 10 is amplified and inverted by the first amplifier 20, generating an output voltage AOUT. The output voltage AOUT is amplified and inverted by the second amplifier 30, generating the power-on reset signal POR.

The voltage level at which the power-on reset signal POR is activated may vary with the ambient temperature of the semiconductor device. Referring to FIG. 2, at a higher ambient temperature, a voltage level PORH of power supply voltage at which the power-on reset signal POR is activated is lower than a voltage level PORL at a lower ambient temperature. With the higher ambient temperature, a voltage level of power supply voltage at which the power-on reset signal POR is activated may be higher than a voltage level with the lower ambient temperature.

Therefore, a power-on reset circuit is needed having a substantially stable power supply voltage level at which the power-on reset signal is activated, substantially independent of temperature variation.

SUMMARY OF THE INVENTION

According to an exemplary embodiment of the present invention, a power-on reset circuit includes a first power-on reset unit, a second power-on reset unit and an OR gate. The first power-on reset unit is configured to generate a first power-on reset signal that is activated at a first level of a power supply voltage at a first temperature, and is activated at a second level of the power supply voltage at a second temperature. The second power-on reset unit is configured to generate a second power-on reset signal that is activated at the second level of the power supply voltage at the first temperature, and is activated at the first level of the power supply voltage at the second temperature. The OR gate executes a logical disjunction operation of the first power-on reset signal and the second power-on reset signal to generate a third power-on reset signal. In such cases, the second level of the power supply voltage is higher than the first level of the power supply voltage, and the second temperature is lower than the first temperature.

A time at which the first power-on reset signal is activated at the first temperature may be substantially equal to a time at which the second power-on reset signal is activated at the second temperature. The third power-on reset signal may be activated at a time substantially the same at the first temperature and the second temperature. At the first temperature, the third power-on reset signal may be activated at the time when the first power-on reset signal is activated, and, at the second temperature, the third power-on reset signal may be activated at the time when the second power-on reset signal is activated.

According to an exemplary embodiment of the present invention, a power-on reset circuit includes a first power-on reset unit, a second power-on reset unit and an AND gate. The first power-on reset unit generates a first power-on reset signal that is activated at a first level of a power supply voltage at a first temperature, and is activated at a second level of the power supply voltage at a second temperature. The second power-on reset unit generates a second power-on reset signal that is activated at the second level of the power supply voltage at the first temperature, and is activated at the first level of the power supply voltage at the second temperature. The AND gate executes a logical conjunction operation of the first power-on reset signal and the second power-on reset signal to generate a third power-on reset signal. In such cases, the second level of the power supply voltage is higher than the first level of the power supply voltage, and the second temperature is lower than the first temperature.

A time at which the first power-on reset signal is activated at the first temperature may be substantially equal to a time at which the second power-on reset signal is activated at the second temperature. The third power-on reset signal may be activated at a time substantially the same at the first temperature and the second temperature. At the first temperature, the third power-on reset signal may be activated at the time when the second power-on reset signal is activated, and, at the second temperature, the third power-on reset signal may be activated at the time when the first power-on reset signal is activated.

According to an exemplary embodiment of the present invention, a method of generating a power-on reset signal includes generating a first power-on reset signal that is activated at a first level of a power supply voltage at a first temperature, and is activated at a second level of the power supply voltage at a second temperature, generating a second power-on reset signal that is activated at the second level of the power supply voltage at the first temperature, and is activated at the first level of the power supply voltage at the second temperature; and executing a logical disjunction operation of the first power-on reset signal and the second power-on reset signal to generate a third power-on reset signal, wherein the second level of the power supply voltage is higher than the first level of the power supply voltage, and the second temperature is lower than the first temperature.

A time at which the first power-on reset signal is activated at the first temperature may be substantially equal to a time at which the second power-on reset signal is activated at the second temperature. The third power-on reset signal may be activated at a time substantially the same at the first temperature and the second temperature. At the first temperature, the third power-on reset signal may be activated at the time when the first power-on reset signal is activated, and, at the second temperature, the third power-on reset signal may be activated at the time when the second power-on reset signal is activated.

According to an exemplary embodiment of the present invention, a method of generating a power-on reset signal includes generating a first power-on reset signal that is activated at a first level of a power supply voltage at a first temperature, and is activated at a second level of the power supply voltage at a second temperature, generating a second power-on reset signal that is activated at the second level of the power supply voltage at the first temperature, and is activated at the first level of the power supply voltage at the second temperature; and executing a logical conjunction operation of the first power-on reset signal and the second power-on reset signal to generate a third power-on reset signal, wherein the second level of the power supply voltage is higher than the first level of the power supply voltage, and the second temperature is lower than the first temperature.

A time at which the first power-on reset signal is activated at the first temperature may be substantially equal to a time at which the second power-on reset signal is activated at the second temperature. The third power-on reset signal may be activated at a time substantially the same at the first temperature and the second temperature. At the first temperature, the third power-on reset signal may be activated at the time when the second power-on reset signal is activated, and, at the second temperature, the third power-on reset signal may be activated at the time when the first power-on reset signal is activated.

BRIEF DESCRIPTION OF THE DRAWINGS

The present invention will become more apparent by describing in detail exemplary embodiments thereof with reference to the accompanying drawings, in which.

DETAILED DESCRIPTION OF PREFERRED EMBODIMENTS

The present invention is described more fully hereinafter with reference to the accompanying drawings, in which embodiments of the invention are shown. This invention may, however, be embodied in many different forms and should not be construed as limited to embodiments set forth herein. Rather, embodiments are provided so that this disclosure will be thorough and complete, and will fully convey the scope of the invention to those skilled in the art. In the drawings, the size and relative sizes of layers and regions may be exaggerated for clarity.

Figure 3:
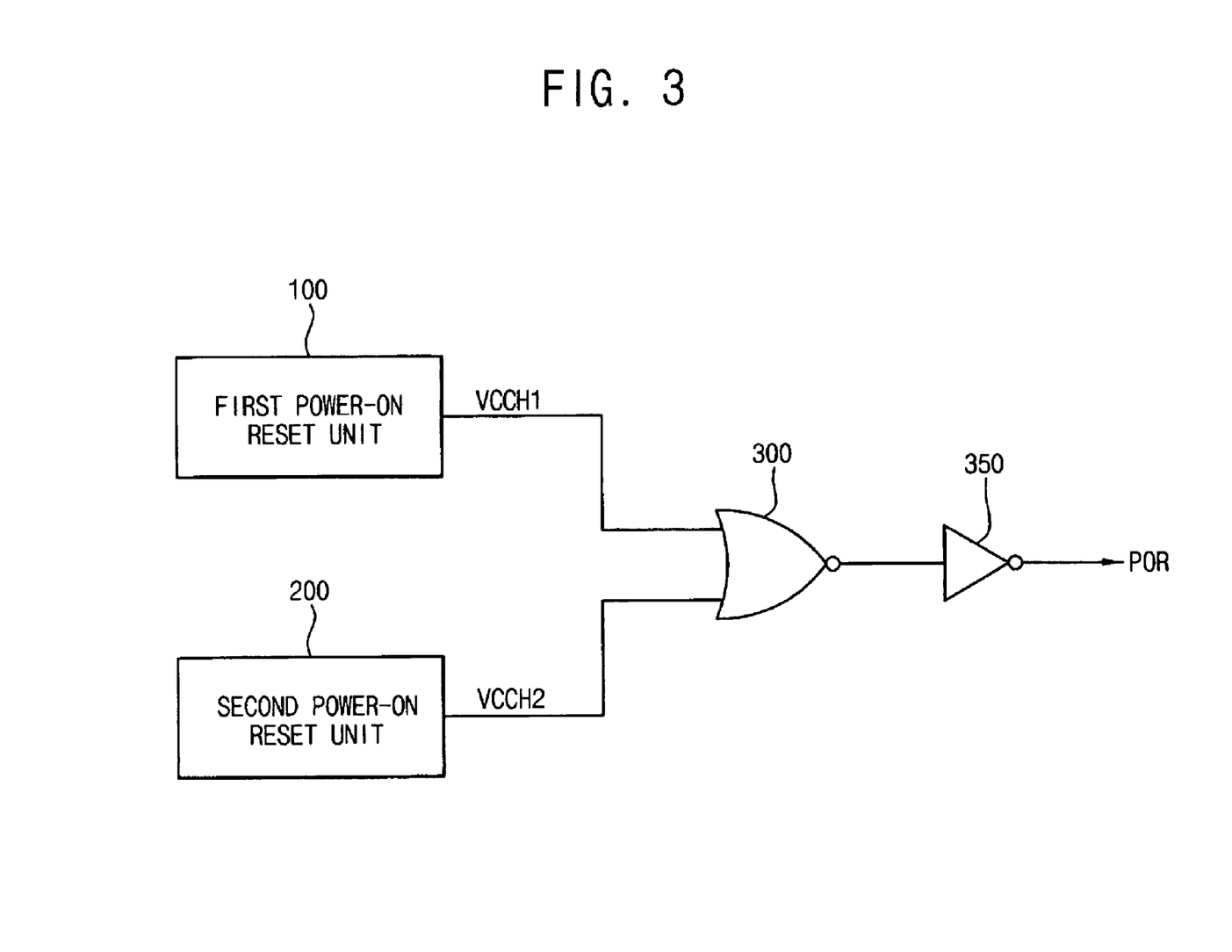
FIG. 3 is a circuit diagram illustrating a power-on reset circuit according to an exemplary embodiment of the present invention.

FIG. 3 is a circuit diagram illustrating a power-on reset circuit according to an exemplary embodiment of the invention. Referring to FIG. 3, the power-on reset circuit includes a first power-on reset unit 100, a second power-on reset unit 200, an NOR gate 300 and an inverter 350.

The first power-on reset unit 100 generates a first power-on reset signal VCCH1, which is activated at a first level of a power supply voltage at a first temperature and is activated at a second level of the power supply voltage at a second temperature. The second temperature is lower than the first temperature and the second level of the power supply voltage is higher than the first level of the power supply voltage. The first temperature, for example, may be as high as about 100° C. and the second temperature may be as low as about −5° C. The second power-on reset unit 200 generates a second power-on reset signal VCCH2, which is activated at the second level of a power supply voltage at the first temperature, and is activated at the first level of the power supply voltage at the second temperature. The NOR gate 300 executes a logical negative disjunction (NOR) operation on the first power-on reset signal VCCH1 and the second power-on reset signal VCCH2. The inverter 350 inverts an output of the NOR gate 300.

In the power-on reset circuit in FIG. 3, a time taken from a power-up until the activation of the first power-on reset signal VCCH1 at the first temperature is substantially the same as a time taken from the power-up until the activation of the second power-on reset signal VCCH2 at the second temperature.

Figure 4:
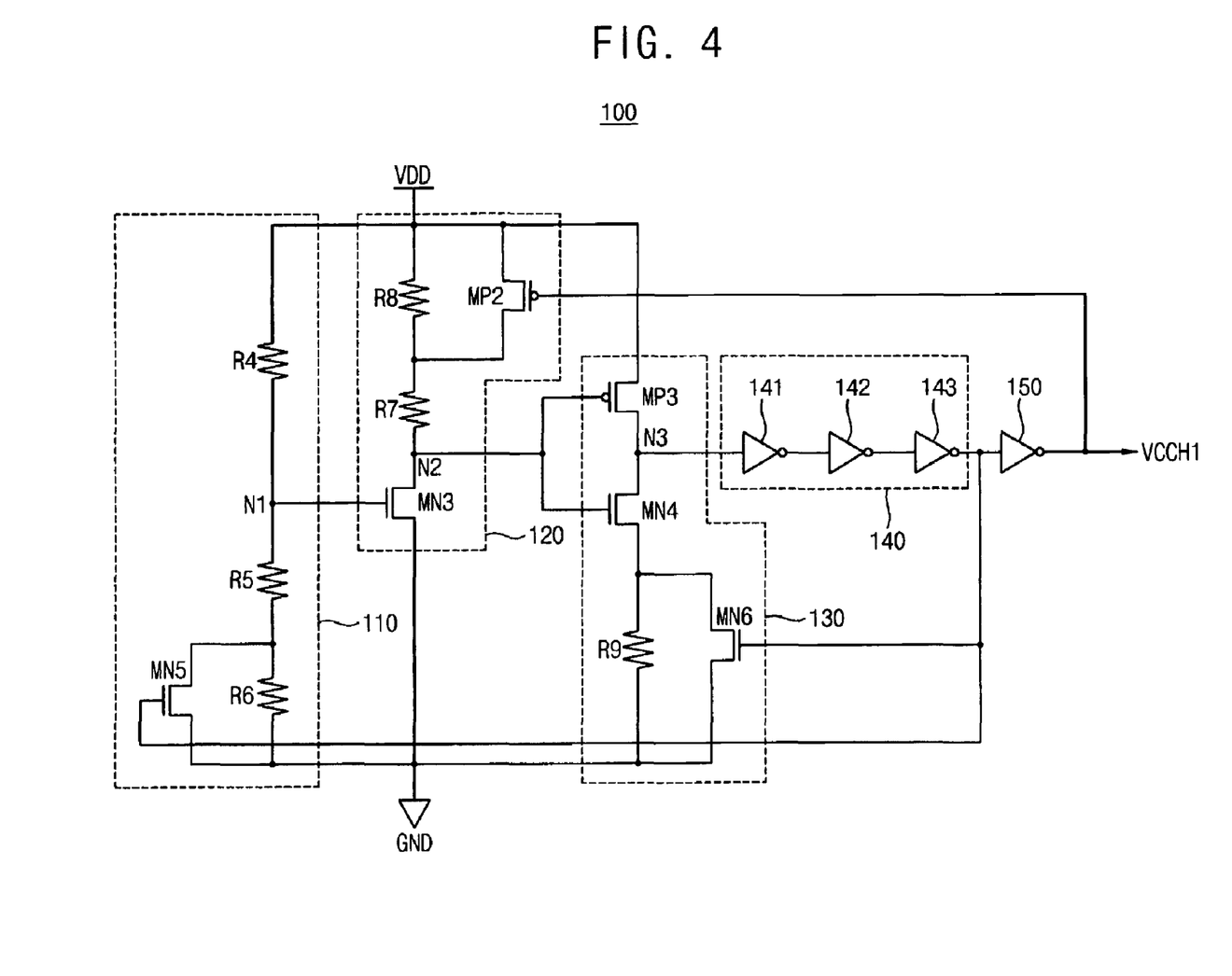
FIG. 4 is a circuit diagram partly illustrating a first power-on reset unit in the power-on reset circuit in FIG. 3.

FIG. 4 is a circuit diagram illustrating a first power-on reset unit in the power-on reset circuit in FIG. 3. Referring to FIG. 4, the first power-on reset unit 100 includes a voltage divider 110, a first amplifier 120, a second amplifier 130, a buffer 140 and an inverter 150.

The voltage divider 110 divides the power supply voltage and outputs a divided voltage signal to a first node N1. The first amplifier 120 amplifies the divided voltage signal of the first node N1 and outputs a first amplified voltage signal to a second node N2. The second amplifier 130 amplifies the first amplified voltage signal of the second node N2 and outputs a second amplified voltage signal to a third node N3. The buffer 140 inverts the second amplified voltage signal of the third node N3 and strengthens a current driving capability. The inverter 150 inverts an output of the buffer 140 and generates the first power-on reset signal VCCH1.

The voltage divider 110 includes first, second and third resistors R4, R5 and R6, and an NMOS transistor MN5. The first resistor R4 is connected between the power supply voltage VDD and the first node N1. The second resistor R5 is connected between the first node N1 and a ground GND. The third resistor R6 is connected between the second resistor R5 and the ground GND. The NMOS transistor MN5 is connected to two ends of the third resistor R6, and is controlled by the output signal of the buffer 140.

The first amplifier 120 includes an NMOS transistor MN3, resistors R7 and R8 and a PMOS transistor MP2.

The NMOS transistor MN3 has a gate connected to the first node N1, a source connected to the ground GND, and a drain connected to the second node N2. The resistor R7 is connected between the drain of the NMOS transistor MN3 and the resistor R8. The resistor R8 is also connected to the power supply voltage VDD. The PMOS transistor MP2 is connected to the two ends of the resistor R8 and controlled by the output signal, of the inverter 150, e.g., the first power-on reset signal VCCH1.

The second amplifier 130 includes a PMOS transistor MP3, an NMOS transistor MN4, a resistor R9 and an NMOS transistor MN6.

The PMOS transistor MP3 has a source connected to the power supply voltage VDD, a drain connected to the third node N3, and a gate connected to the second node N2. The NMOS transistor MN4 has a source connected to the drain of the PMOS transistor MP3, a drain connected to the resistor R9, and a gate connected to the second node N2. The resistor R9 is also connected to the ground GND. The NMOS transistor MN6 is connected to two ends of the resistor R9 and has a gate connected to the output of the buffer 140.

The buffer 140 includes an odd number of inverters 141, 142 and 143.

The operation of the first power-on reset unit 100 of FIG. 4 is described below.

As a level of the power supply voltage VDD increases from zero voltage, the voltage level of the second node N2 increases via the resistors R7 and R8. With a sufficient voltage level of the second node N2, the NMOS transistor MN4 is turned on, the third node N3 is changed to a logic 'low' state, and the output signal of the buffer 140 is changed to a logic 'high' state. The output signal of the inverter 150, e.g., the first power-on reset signal VCCH1, is a logic 'low' state.

As the level of the power supply voltage VDD increases, the NMOS transistor MN3 is turned on by the voltage level of the first node N1, and the second node N2 is changed to a logic 'low' state. The PMOS transistor MP3 is turned on by the voltage level of the second node N2, the third node N3 is changed to a logic 'high' state, and the output signal of the buffer 140 is changed to a logic 'low' state. The output signal VCCH1 of the inverter 150 is changed to a logic 'high' state. With the first power-on reset signal having a logic high state, the internal circuits of the semiconductor device, such as latches and flip-flops, are activated. The power supply voltage VDD is substantially related to the resistors R4, R5 and R6 by an expression VDD=V(N1)× (R4+R5+R6)/(R5+R6), and the voltage level of the power supply voltage VDD, at which the first power-on reset signal VCCH1 is changed to a logic 'high' state, is substantially determined by the resistances of the resistors R4, R5 and R6.

The NMOS transistors MN5 and MN6 and the PMOS transistor MP2 allow the output signal VCCH1 of the first power-on reset unit 100 to have a hysteresis characteristic, which is caused by feeding back an inverted signal of the first power-on reset signal VCCH1 (e.g., the output of the buffer 140) to the gates of the NMOS transistors MN5 and MN6, and by feeding back the first power-on reset signal VCCH1 to the gate of the PMOS transistor MP2. Even when the voltage level of the power supply voltage VDD drops below a certain level temporarily, or a power dip occurs after the first power-on reset signal VCCH1 is activated, the first power-on reset signal may be substantially prevented from a false deactivation.

The operational characteristics of the first power-on reset unit 100 are a result of the first amplifier 120 and the voltage divider 110. The size (width/length ratio, i.e., W/L) of the NMOS transistor MN3 and values of the resistors R4-R8 are appropriate to obtain the first power-on reset signal VCCH1 that has different properties according to different temperatures.

Figure 5:
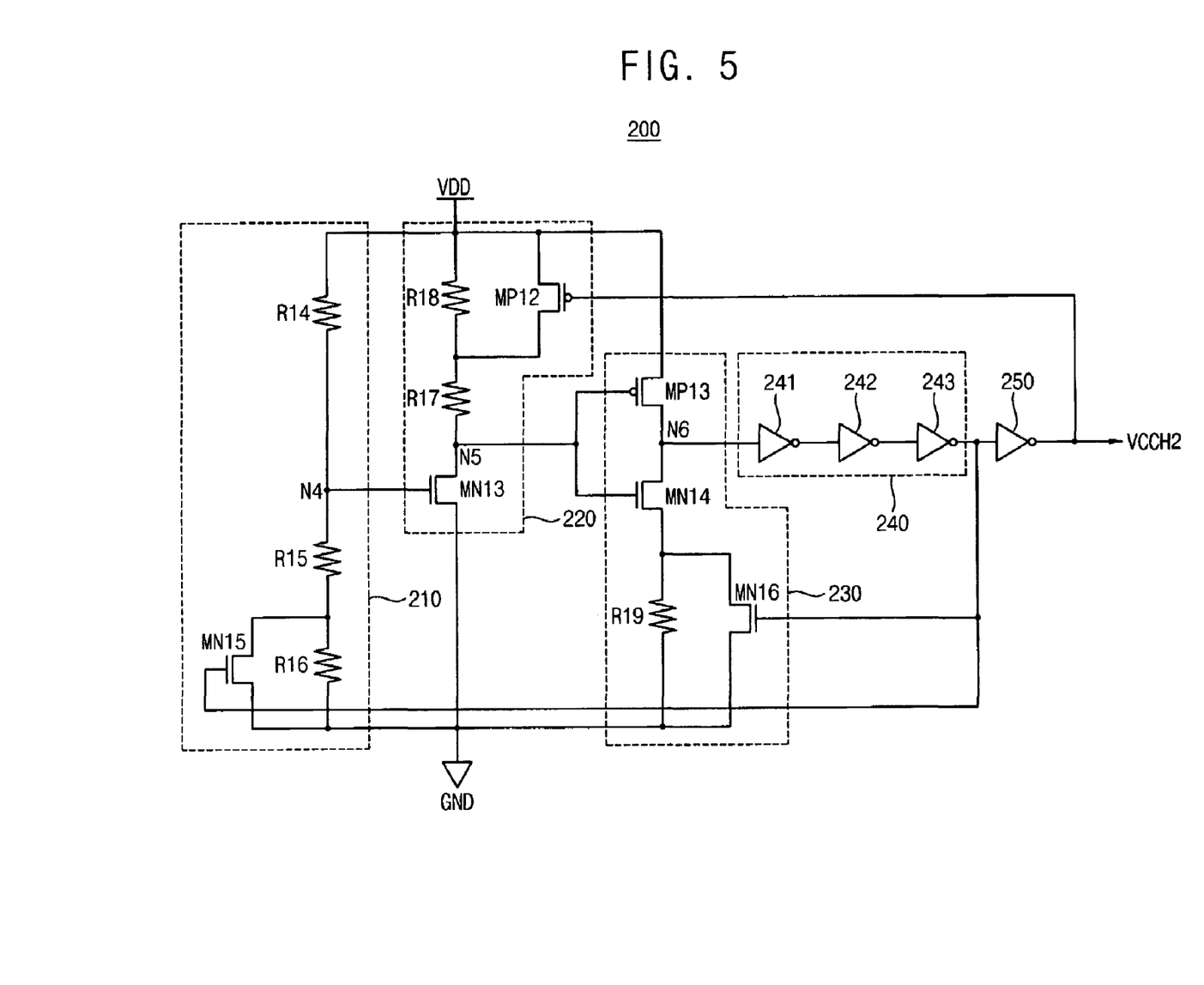
FIG. 5 is a circuit diagram partly illustrating a second power-on reset unit in the power-on reset circuit in FIG. 3.

FIG. 5 is a circuit diagram illustrating the second power-on reset unit 200, in the power-on reset circuit in FIG. 3. The second power-on reset unit 200 has substantially the same circuit configuration as the power-on reset unit 100 in FIG. 4, except that circuit elements of the second power-on reset unit 200 have different values from corresponding circuit elements of the power-on reset unit 100, giving different temperature dependent characteristics. More particularly, the temperature characteristics are dominated by values of the elements in a voltage divider 210 and in a first amplifier 220. Different values of the voltage divider 210 and in the first amplifier 220 result in the second power-on reset unit 200 to have different temperature characteristics from that of the first power-on reset unit 100.

Referring to FIG. 5, the second power-on reset unit 200 includes the voltage divider 210, the first amplifier 220, a second amplifier 230, a buffer 240 and an inverter 250.

The voltage divider 210 divides the power supply voltage VDD and outputs a divided voltage to a first node N4. The first amplifier 220 amplifies the divided voltage signal of the first node N4 and outputs a first amplified voltage to a second node N5. The second amplifier 220 amplifies the first amplified voltage signal of the second node N5 and outputs a second amplified voltage to a third node N6. The buffer 240 inverts the second amplified voltage signal of the third node N6 and strengthens a current driving capability. The inverter 250 inverts an output of the buffer 240 to generate the second power-on reset signal VCCH2.

The operation of the second power-on reset unit 200 in FIG. 5 is substantially the same as the operation of the first power-on reset unit 100 in FIG. 4, and is omitted.

Figure 6A:
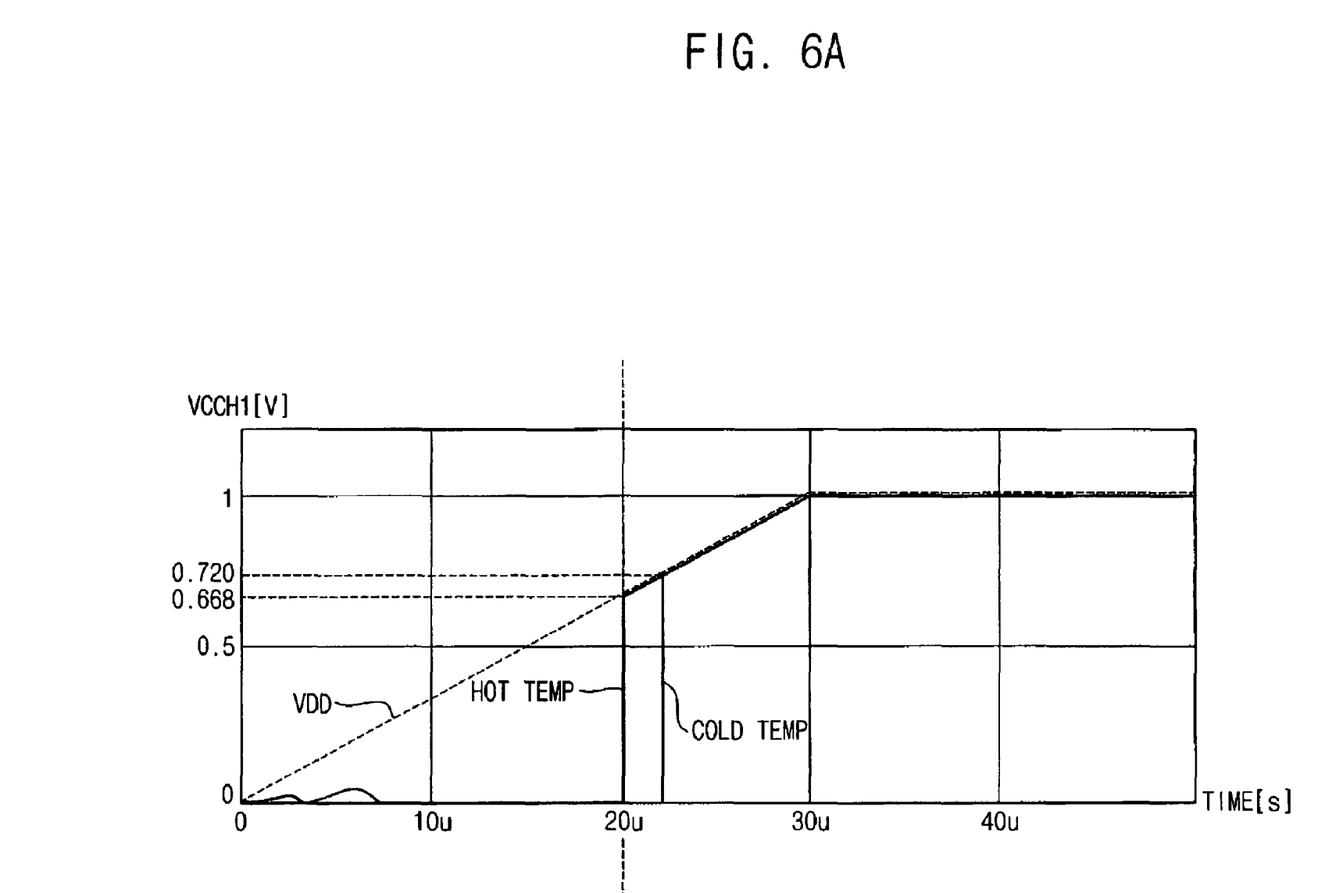
FIG. 6A is a graph showing an output waveform of the first power-on reset unit in FIG. 4.
Figure 6B:
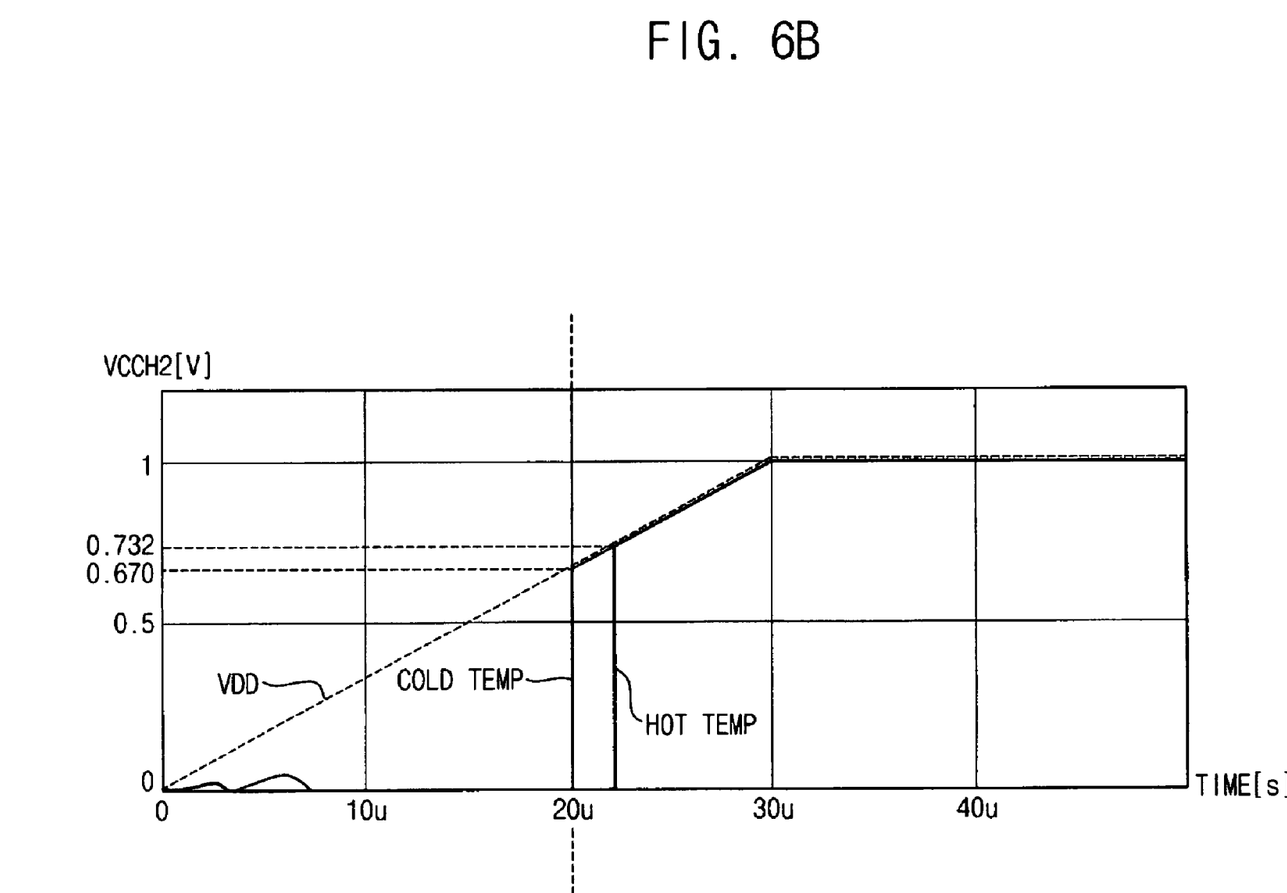
FIG. 6B is a graph showing an output waveform of the second power-on reset unit in FIG. 5.
Figure 6C:
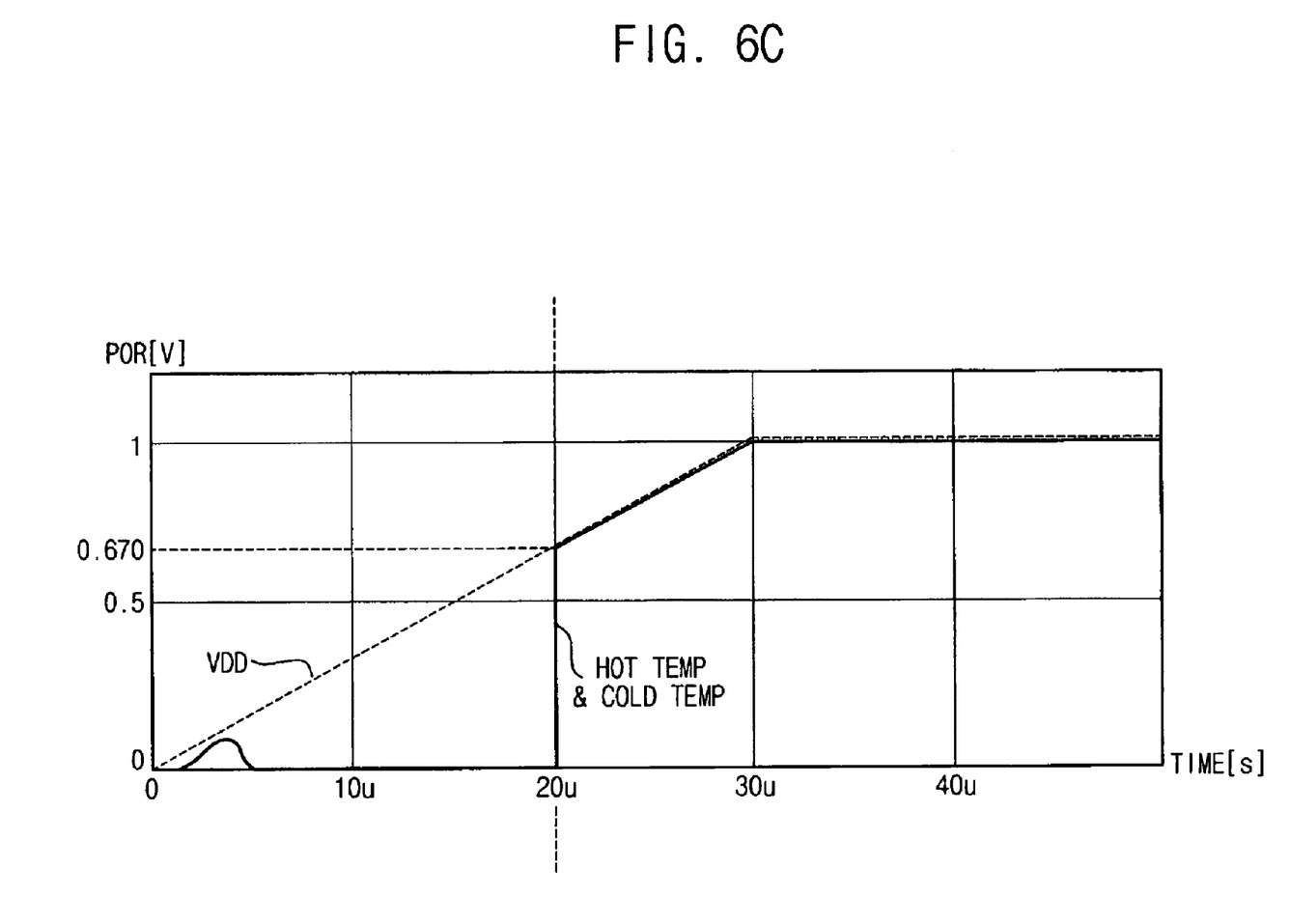
FIG. 6C is a graph showing an output waveform of the power-on reset circuit in FIG. 3.

FIG. 6A is a graph showing an output waveform of the first power-on reset unit 100 in FIG. 4. FIG. 6B is a graph showing an output waveform of the second power-on reset unit 200 in FIG. 5. FIG. 6C is a graph showing an output waveform of the power-on reset circuit in FIG. 3, where a voltage level, at which the first power-on reset signal VCCH1 is activated at a higher temperature HOT TEMP, is substantially equal to a voltage level at which the second power-on reset signal VCCH2 is activated at a lower temperature COLD TEMP.

Referring to FIGS. 3-6C, the power-on reset circuit according to the embodiments of the invention will be described.

The waveforms in FIGS. 6A, 6B and 6C are results of the simulations under the following conditions:

1) HOT TEMP=100° C. and COL TEMP=−5° C.,
2) W/L of the transistor MN3=2/1, R4=165 kΩ, R5=200 kΩ, R7=300 kΩ, R6=R8=0 Ω (short-circuited), and the transistors MN5 and MP2 are disregarded, 3) W/L of the transistor MN13=2/6, R14=40 kΩ, R15=800 kΩ, R17=100 kΩ, R16=R18=0Ω (short-circuited), and the transistors MN15 and MP12 are disregarded.

Referring to FIG. 6A, a voltage level of the power supply voltage VDD to activate the first power-on reset signal VCCH1 at the higher temperature HOT TEMP, or 100° C., is lower than a voltage level of the power supply voltage VDD to activate the first power-on reset signal VCCH1 at the lower temperature COLD TEMP, or −5° C. The first power-on reset signal VCCH1 is activated earlier at the higher temperature HOT TEMP than at the lower temperature COLD TEMP. In the example of FIG. 6A, the voltage level to activate the first power-on reset signal VCCH1 at the higher temperature HOT TEMP is 0.668V, and the voltage level to activate the first power-on reset signal VCCH1 at the lower temperature COLD TEMP is 0.720V.

Referring to FIG. 6B, a voltage level of the power supply voltage VDD to activate the second power-on reset signal VCCH2 at the higher temperature HOT TEMP, or 100° C., is higher than a voltage level of the power supply voltage VDD to activate the second power-on reset signal VCCH2 at the lower temperature COLD TEMP, or −5° C. The second power-on reset signal VCCH2 is activated later at the higher temperature HOT TEMP than at the lower temperature COLD TEMP. In the example of FIG. 6B, the voltage level to activate the second power-on reset signal VCCH2 at the higher temperature HOT TEMP is 0.732V, and the voltage level to activate the second power-on reset signal VCCH2 at the lower temperature COLD TEMP is 0.670V.

Referring to FIG. 6C, a power-on reset signal POR is activated at substantially the same point of time and at a substantially equal level of power supply voltage at the higher temperature HOT TEMP and the lower temperature COLD TEMP. The power-on reset circuit in FIG. 3 has a configuration in which the activation time of the first power-on reset signal VCCH1 at the higher temperature HOT TEMP is substantially the same as the activation time of the second power-on reset signal VCCH2 at the lower temperature COLD TEMP. Additionally, the power-on reset circuit in FIG. 3 may include the NOR gate 300 and the inverter 350, which together execute a disjunction operation of the first power-on reset signal VCCH1 from the first power-on reset unit 100 and the second power-on reset signal VCCH2 from the second power-on reset unit 200.

At the higher temperature HOT TEMP, the power-on reset signal POR from the power-on reset circuit in FIG. 3 is changed to a logic 'high' state, at substantially the time when the first power-on reset signal VCCH1 from the first power-on reset unit 100 is changed to a logic 'high' state. At the lower temperature COLD TEMP, the power-on reset signal POR from the power-on reset circuit in FIG. 3 is changed to a logic 'high' state, at substantially the time when the second power-on reset signal VCCH2 from the second power-on reset unit 200 is changed to a logic 'high' state. The power-on reset signal POR is turned into a logic 'high' state at substantially the same point of time at a higher temperature and at a lower temperature, because the power-on reset circuit in FIG. 3 has a configuration in which the activation time of the first power-on reset signal VCCH1 at the higher temperature HOT TEMP is substantially the same as the activation time of the second power-on reset signal VCCH2 at the lower temperature COLD TEMP.

Figure 7:
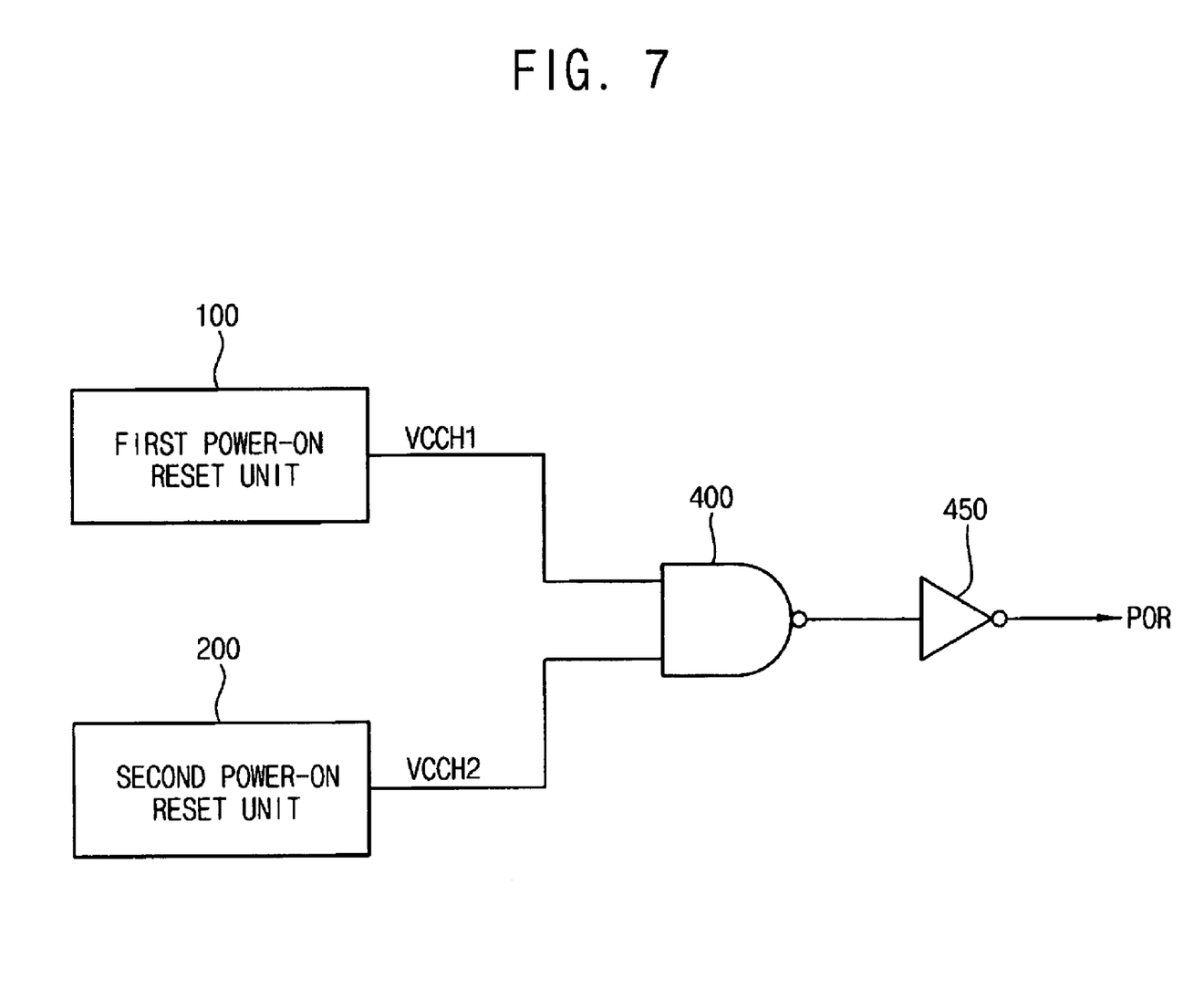
FIG. 7 is a circuit diagram illustrating a power-on reset circuit according to an exemplary embodiment of the present invention.

FIG. 7 is a circuit diagram illustrating a power-on reset circuit according to an exemplary embodiment of the present invention. Referring to FIG. 7, the power-on reset circuit includes the first power-on reset unit 100, the second power-on reset unit 200, a NAND gate 400 and an inverter 450. The first and second power-on reset units 100 and 200 of the power-on reset circuit in FIG. 7 have substantially the same configurations as the first and second power-on reset units 100 and 200 of the power-on reset circuits in FIGS. 4 and 5.

The first power-on reset unit 100 generates a first power-on reset signal VCCH1, which is activated at a first level of a power supply voltage at a first temperature and is activated at a second level of the power supply voltage at a second temperature, wherein the second temperature is lower than the first temperature and the second level of the power supply voltage is higher than the first level of the power supply voltage. The first temperature, for example, may be as high as about 100° C. and the second temperature may be as low as about −5° C. The second power-on reset unit 200 generates a second power-on reset signal VCCH2, which is activated at the second level of a power supply voltage at the first temperature, and is activated at the first level of the power supply voltage at the second temperature. The NOR gate 400 executes a logical negative disjunction operation on the first power-on reset signal VCCH1 and the second power-on reset signal VCCH2. The inverter 450 inverts an output of the NOR gate 400.

In the power-on reset circuit according to an embodiment of the present invention, a time taken from the power-up until the activation of the first power-on reset signal VCCH1 at the second temperature is substantially the same as a time taken from the power-up until the activation of the second power-on reset signal VCCH2 at the first temperature.

The power-on reset circuit in FIG. 7 executes a logical conjunction (AND) operation on the first power-on reset signal VCCH1 from the first power-on reset unit 100 and the second power-on reset signal VCCH2 from the second power-on reset unit 200 via the NAND gate 400 and the inverter 450.

Figure 8A:
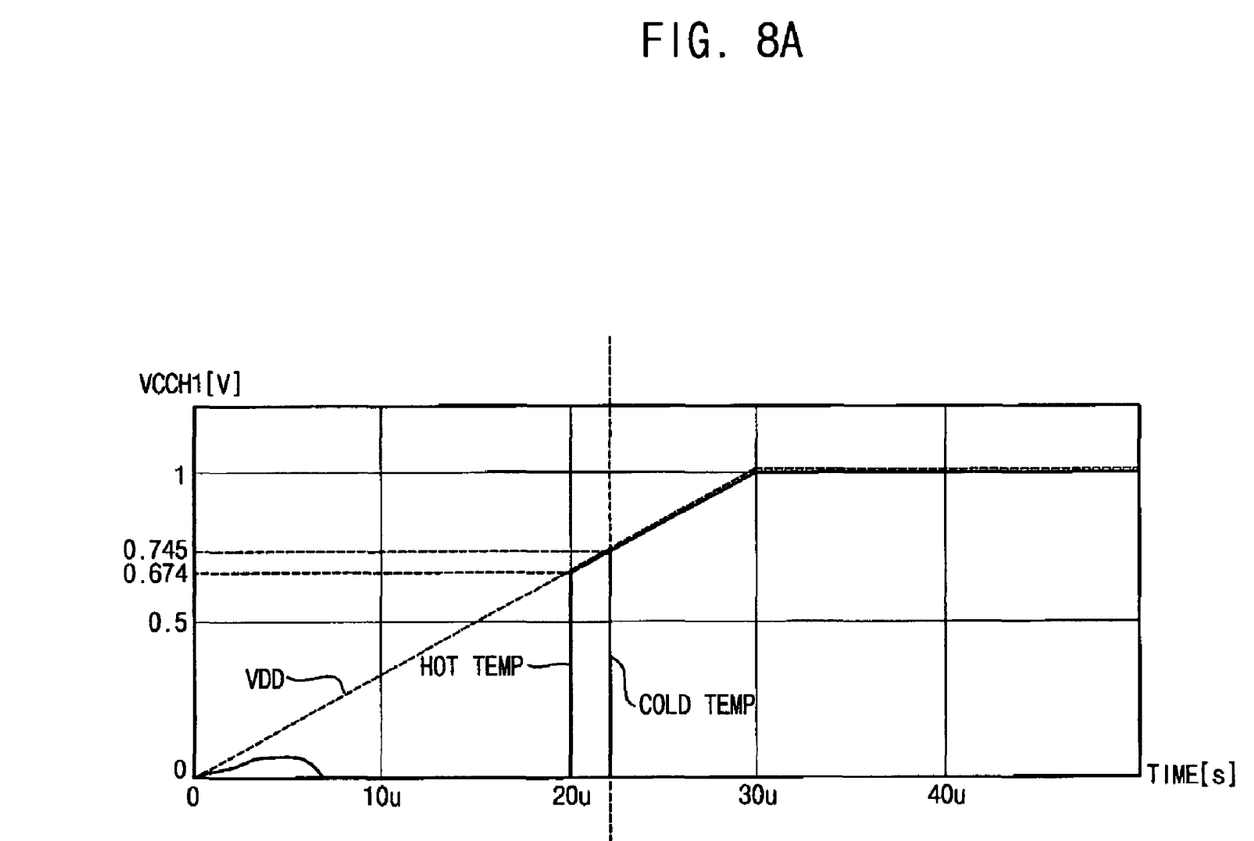
FIG. 8A is a graph showing an output waveform of a first power-on reset unit included in the power-on reset circuit in FIG. 7.
Figure 8B:
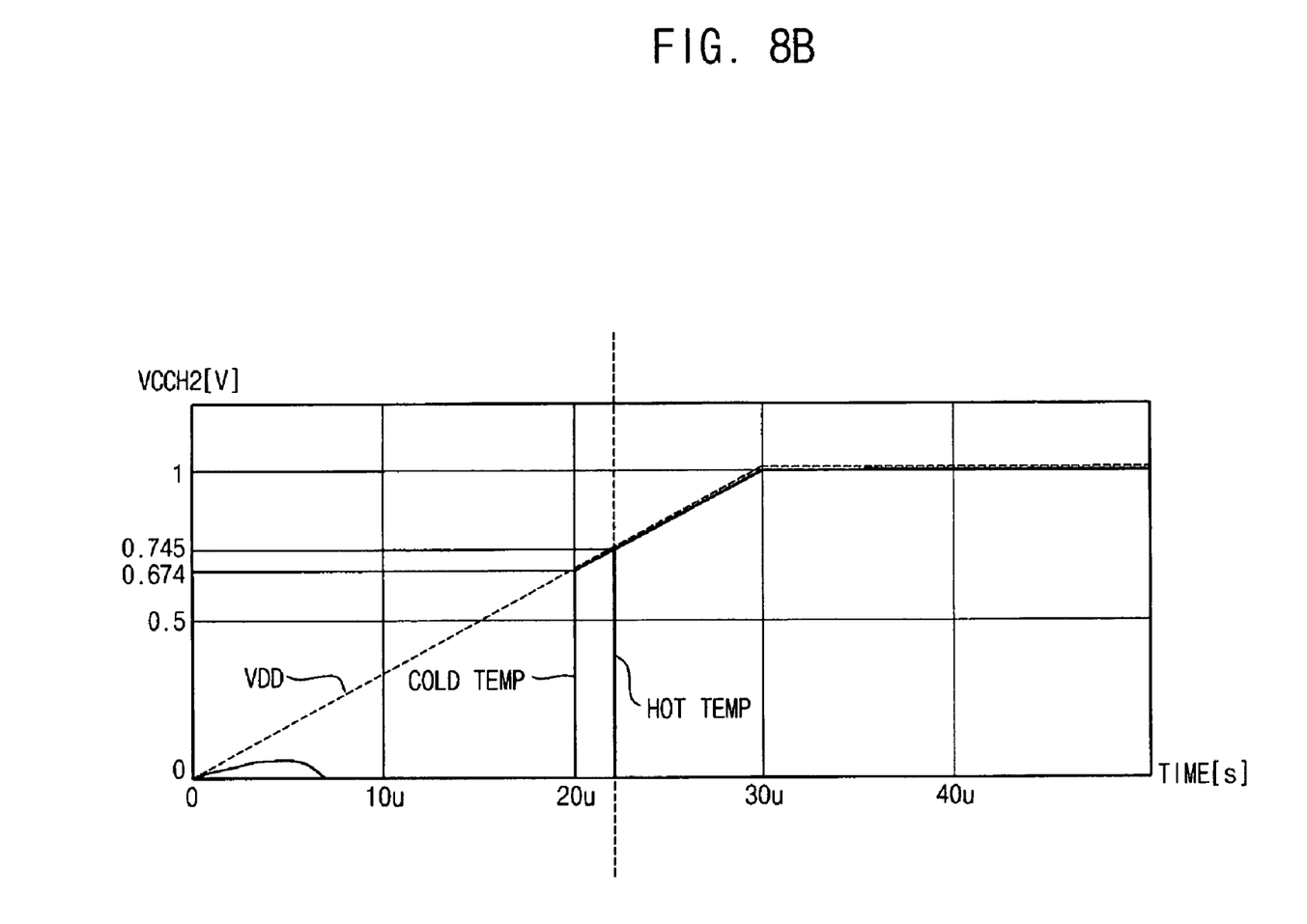
FIG. 8B is a graph showing an output waveform of a second power-on reset unit included in the power-on reset circuit in FIG. 7.

FIG. 8A is a graph showing an output waveform of a first power-on reset unit 100 included in the power-on reset circuit in FIG. 7. FIG. 8B is a graph showing an output waveform of a second power-on reset unit 200 included in the power-on reset circuit in FIG. 7.

Figure 8C:
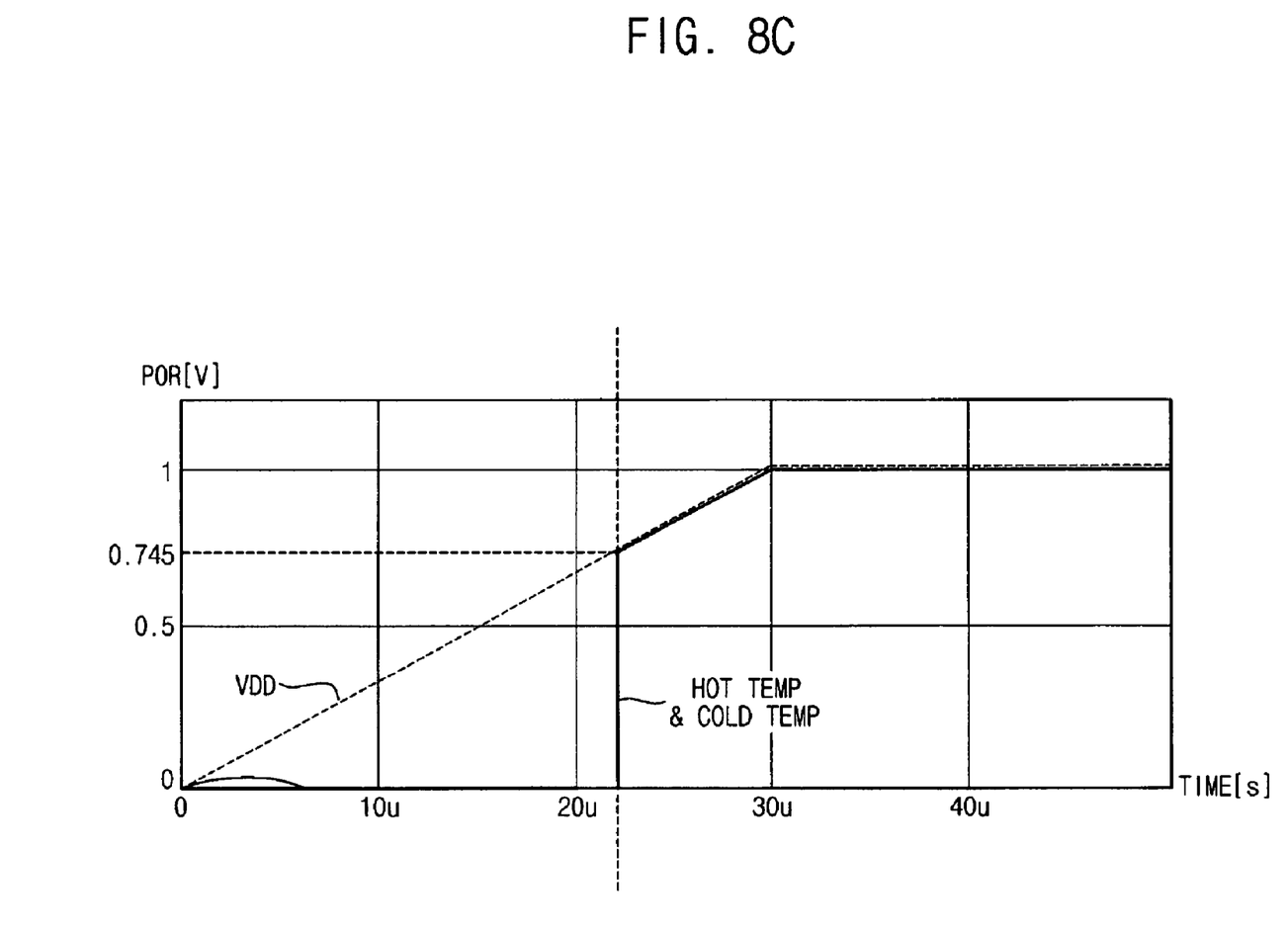
FIG. 8C is a graph showing an output waveform of the power-on reset circuit in FIG. 7.

FIG. 8C is a graph showing an output waveform of the power-on reset circuit in FIG. 7, where a point of time when the first power-on reset signal VCCH1 is activated at a higher temperature HOT TEMP, is substantially equal to a point of time when the second power-on reset signal VCCH2 is activated at a lower temperature COLD TEMP.

The waveforms in FIGS. 8A, 8B and 8C are results of simulations performed under the same conditions as the simulations in FIGS. 6A, 6B and 6C.

Referring to FIGS. 7-8C, the operation of the power-on reset circuit according to an embodiment of the present invention will be described.

Referring to FIG. 8A, a voltage level of the power supply voltage VDD to activate the first power-on reset signal VCCH1 at the higher temperature HOT TEMP, or 100° C., is lower than a voltage level of the power supply voltage VDD to activate the first power-on reset signal VCCH1 at the lower temperature COLD TEMP, or −5° C. The first power-on reset signal VCCH1 is activated earlier at the higher temperature HOT TEMP than at the lower temperature COLD TEMP. In the example of FIG. 8A, the voltage level to activate the first power-on reset signal VCCH1 at the higher temperature HOT TEMP is 0.674V, and the voltage level to activate the first power-on reset signal VCCH1 at the lower temperature COLD TEMP is 0.745V.

Referring to FIG. 8B, a voltage level of the power supply voltage VDD to activate the second power-on reset signal VCCH2 at the higher temperature HOT TEMP, or 100° C., is higher than a voltage level of the power supply voltage VDD to activate the second power-on reset signal VCCH2 at the lower temperature COLD TEMP, or −5° C. The second power-on reset signal VCCH2 is activated later at the higher temperature HOT TEMP than at the lower temperature COLD TEMP. In the example of FIG. 8B, the voltage level to activate the second power-on reset signal VCCH2 at the higher temperature HOT TEMP is 0.745V, and the voltage level to activate the second power-on reset signal VCCH2 at the lower temperature COLD TEMP is 0.674V.

Referring to FIG. 8C, a power-on reset signal POR is activated at substantially the same point of time and at a substantially equal level of power supply voltage at either the higher temperature HOT TEMP or the lower temperature COLD TEMP. The power-on reset circuit in FIG. 7 has a configuration in which the activation time of the first power-on reset signal VCCH1 at the lower temperature COLD TEMP is substantially the same as the activation time of the second power-on reset signal VCCH2 at the higher temperature HOT TEMP. Additionally, the power-on reset circuit in FIG. 7 may include the NAND gate 400 and the inverter 450, which together execute a conjunction operation on the first power-on reset signal VCCH1 from the first power-on reset unit 100 and the second power-on reset signal VCCH2 from the second power-on reset unit 200.

At the lower temperature COLD TEMP, the power-on reset signal POR from the power-on reset circuit in FIG. 7 is changed to a logic 'high' state, at the time when the first power-on reset signal VCCH1 from the first power-on reset unit 100 is changed to a logic 'high' state. At the higher temperature HOT TEMP, the power-on reset signal POR from the power-on reset circuit in FIG. 7 is changed to a logic 'high' state, at the time when the second power-on reset signal VCCH2 from the second power-on reset unit 200 is changed to a logic 'high' state. The power-on reset signal POR is changed to a logic 'high' state at substantially the same point of time at a higher temperature and at a lower temperature, because the power-on reset circuit in FIG. 7 has a configuration in which the activation time of the first power-on reset signal VCCH1 at the lower temperature COLD TEMP is substantially the same as the activation time of the second power-on reset signal VCCH2 at the higher temperature HOT TEMP.

A power-on reset circuit according to an embodiment of the present invention may reduce variation of the voltage level where the power-on reset signal is activated, despite variation of the ambient temperature or variation of the manufacturing process. The power-on reset circuit according to an embodiment of the present invention allows the internal circuits of the semiconductor device to be activated by the power-on reset signal at a given time and a given power supply voltage level, substantially independent of the ambient temperature.

The foregoing is illustrative of the present invention and is not to be construed as limiting thereof. Although exemplary embodiments of the present invention have been described, those skilled in the art will readily appreciate that many modifications are possible in the example embodiments without materially departing from the teachings of this disclosure. Accordingly, all such modifications are intended to be included within the scope of the disclosure.

What is claimed is:

1. A power-on reset circuit comprising:
    a first power-on reset unit for generating a first power-on reset signal that is activated at a first level of a power supply voltage at a first temperature, and is activated at a second level of the power supply voltage at a second temperature;
    a second power-on reset unit for generating a second power-on reset signal that is activated at the second level of the power supply voltage at the first temperature, and is activated at the first level of the power supply voltage at the second temperature; and
    an gate for executing a logical operation on the first power-on reset signal and the second power-on reset signal to generate a third power-on reset signal,
    wherein the second level of the power supply voltage is higher than the first level of the power supply voltage, and the second temperature is lower than the first temperature.

2. The power-on reset circuit of claim 1, wherein a time at which the first power-on reset signal is activated at the first temperature is substantially equal to a time at which the second power-on reset signal is activated at the second temperature.

3. The power-on reset circuit of claim 1, wherein the gate is an OR gate and the logical operation is a disjunction.

4. The power-on reset circuit of claim 3, wherein the third power-on reset signal is activated at a time that is substantially the same at either the first temperature or the second temperature.

5. The power-on reset circuit of claim 4, wherein
    at the first temperature, the third power-on reset signal is activated at the time when the first power-on reset signal is activated, and,
    at the second temperature, the third power-on reset signal is activated at the time when the second power-on reset signal is activated.

6. The power-on reset circuit of claim 5, wherein the first power-on reset unit comprises:
    a voltage divider for dividing the power supply voltage and outputting a divided voltage signal to a first node;
    a first amplifier for amplifying the divided voltage signal on the first node and outputting a first amplified signal to a second node; and
    a second amplifier for amplifying the first amplified signal on the second node, generating a second amplified signal and outputting the second amplified signal to a third node.

7. The power-on reset circuit of claim 6, wherein the first power-on reset unit further comprises:
    a first buffer for inverting the second amplified signal on the third node; and
    a first inverter for inverting a signal of the first buffer and generating the first power-on reset signal.

8. The power-on reset circuit of claim 7, wherein the voltage divider comprises:
    a first resistor connected between the power supply voltage and the first node; and
    a second resistor connected between the first node and a ground.

9. The power-on reset circuit of claim 8, wherein the voltage divider comprises:
    a third resistor connected between the second resistor and the ground; and
    a transistor connected between two ends of the third resistor and controlled by the signal of the first buffer.

10. The power-on reset circuit of claim 7, wherein the first amplifier comprises:
    an NMOS transistor that has a gate connected to the first node, a source connected to the ground, and a drain connected to the second node; and a first resistor connected between the second node and the power supply voltage.

11. The power-on reset circuit of claim 10, wherein the first amplifier further comprises:
   a second resistor connected between the first resistor and the power supply voltage; and
   a PMOS transistor connected between the two ends of the second resistor and controlled by the first power-on reset signal of the first inverter.

12. The power-on reset circuit of claim 7, wherein the second amplifier comprises:
   a PMOS transistor that has a source connected to the power supply voltage, a drain connected to the third node, and a gate connected to the second node; and
   an NMOS transistor that has a source connected to the ground, a drain connected to the third node, and a gate connected to the second node.

13. The power-on reset circuit of claim 12, wherein the second amplifier further comprises:
   a resistor connected between the source of the first NMOS transistor and the ground; and
   a transistor connected between two ends of the resistor and controlled by the signal of the first buffer.

14. The power-on reset circuit of claim 5, wherein the second power-on reset unit comprises:
   a voltage divider for dividing the power supply voltage and outputting a divided voltage signal to a first node;
   a first amplifier for amplifying the divided voltage signal on the first node and outputting a first amplified signal to a second node; and
   a second amplifier for amplifying the first amplified signal on the second node, generating a second amplified signal and outputting the second amplified signal to a third node.

15. The power-on reset circuit of claim 14, wherein the second power-on reset unit further comprises:
   a first buffer for inverting the second amplified signal on the third node; and
   a first inverter for inverting a signal of the first buffer and generating the second power-on reset signal.

16. The power-on reset circuit of claim 15, wherein the voltage divider comprises:
   a first resistor connected between the power supply voltage and the first node; and
   a second resistor connected between the first node and a ground.

17. The power-on reset circuit of claim 16, wherein the voltage divider comprises:
   a third resistor connected between the second resistor and the ground; and
   a transistor connected between two ends of the third resistor and controlled by the signal of the first buffer.

18. The power-on reset circuit of claim 15, wherein the first amplifier comprises:
   an NMOS transistor that has a gate connected to the first node, a source connected to the ground, and a drain connected to the second node; and
   a first resistor connected between the second node and the power supply voltage.

19. The power-on reset circuit of claim 18, wherein the first amplifier further comprises:
   a second resistor connected between the first resistor and the power supply voltage; and
   a PMOS transistor connected between the two ends of the second resistor and controlled by the second power-on reset signal of the first inverter.

20. The power-on reset circuit of claim 15, wherein the second amplifier comprises:
   a PMOS transistor that has a source connected to the power supply voltage, a drain connected to the third node, and a gate connected to the second node; and
   an NMOS transistor that has a source connected to the ground, a drain connected to the third node, and a gate connected to the second node.

21. The power-on reset circuit of claim 20, wherein the second amplifier further comprises:
   a resistor connected between the source of the first NMOS transistor and the ground; and
   a transistor connected between two ends of the resistor and controlled by the signal of the first buffer.

22. The power-on reset circuit of claim 1, wherein the gate is an AND gate and the logical operation is a conjunction.

23. The power-on reset circuit of claim 22, wherein a time at which the first power-on reset signal is activated at the second temperature is substantially equal to a time at which the second power-on reset signal is activated at the first temperature.

24. The power-on reset circuit of claim 22, wherein
   at the first temperature, the third power-on reset signal is activated at the time when the second power-on reset signal is activated, and,
   at the second temperature, the third power-on reset signal is activated at the time when the first power-on reset signal is activated.

25. The power-on reset circuit of claim 24, wherein the first power-on reset unit comprises:
   a voltage divider for dividing the power supply voltage and outputting a divided voltage signal to a first node;
   a first amplifier for amplifying the divided voltage signal on the first node and outputting a first amplified signal to a second node; and
   a second amplifier for amplifying the first amplified signal on the second node, generating a second amplified signal and outputting the second amplified signal to a third node.

26. The power-on reset circuit of claim 25, wherein the first power-on reset unit further comprises:
   a first buffer for inverting the second amplified signal on the third node; and
   a first inverter for inverting a signal of the first buffer and generating the first power-on reset signal.

27. The power-on reset circuit of claim 24, wherein the second power-on reset unit comprises:
   a voltage divider for dividing the power supply voltage and outputting a divided voltage signal to a first node;
   a first amplifier for amplifying the divided voltage signal on the first node and outputting a first amplified signal to a second node; and
   a second amplifier for amplifying the first amplified signal on the second node to generate a second amplified signal and outputting the second amplified signal to a third node.

28. The power-on reset circuit of claim 27, wherein the second power-on reset unit further comprises:
   a first buffer for inverting the second amplified signal on the third node; and
   a first inverter for inverting a signal from the first buffer and generating the second power-on reset signal.

29. A method of generating a power-on reset signal comprising:
   generating a first power-on reset signal that is activated at a first level of a power supply voltage at a first temperature, and is activated at a second level of the power supply voltage at a second temperature;

generating a second power-on reset signal that is activated at the second level of the power supply voltage at the first temperature, and is activated at the first level of the power supply voltage at the second temperature; and executing a logical disjunction operation or a logical conjunction operation on the first power-on reset signal and the second power-on reset signal to generate a third power-on reset signal, wherein the second level of the power supply voltage is higher than the first level of the power supply voltage, and the second temperature is lower than the first temperature.

30. The method of claim 29, wherein a time at which the first power-on reset signal is activated at the second temperature is substantially equal to a time at which the second power-on reset signal is activated at the first temperature.

31. The method of claim 30, wherein the third power-on reset signal is activated at substantially the same point of time at the first temperature and the second temperature.

32. The method of claim 31, wherein at the first temperature, the third power-on reset signal is activated at the time when the first power-on reset signal is activated, and, at the second temperature, the third power-on reset signal is activated at the time when the second power-on reset signal is activated.

33. The method of claim 29, wherein at the first temperature, the third power-on reset signal is activated at the time when the second power-on reset signal is activated, and, at the second temperature, the third power-on reset signal is activated at the time when the first power-on reset signal is activated.

* * * * *